US011233113B2

(12) United States Patent
Yu et al.

(10) Patent No.: US 11,233,113 B2
(45) Date of Patent: *Jan. 25, 2022

(54) LIGHT-EMITTING DIODE DISPLAYS

(71) Applicant: Apple Inc., Cupertino, CA (US)

(72) Inventors: Cheng-Ho Yu, Milpitas, CA (US); Chin-Wei Lin, San Jose, CA (US); Shyuan Yang, Burlingame, CA (US); Ting-Kuo Chang, San Jose, CA (US); Tsung-Ting Tsai, Cupertino, CA (US); Warren S. Rieutort-Louis, Cupertino, CA (US); Shih-Chang Chang, Cupertino, CA (US); Yu Cheng Chen, San Jose, CA (US); John Z. Zhong, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 38 days.

This patent is subject to a terminal disclaimer.

(21) Appl. No.: 16/826,521

(22) Filed: Mar. 23, 2020

(65) Prior Publication Data

US 2020/0219945 A1    Jul. 9, 2020

Related U.S. Application Data

(63) Continuation of application No. 16/224,607, filed on Dec. 18, 2018, now Pat. No. 10,636,847, which is a
(Continued)

(51) Int. Cl.
*H01L 27/32* (2006.01)
*G09G 3/3233* (2016.01)
*G09G 3/3266* (2016.01)
*G06F 3/044* (2006.01)

(52) U.S. Cl.
CPC ....... *H01L 27/3276* (2013.01); *G09G 3/3233* (2013.01); *G09G 3/3266* (2013.01);
(Continued)

(58) Field of Classification Search
CPC ............... G09G 3/3233; G09G 3/3266; G09G 2320/0233; G09G 2300/0413;
(Continued)

(56) References Cited

U.S. PATENT DOCUMENTS

2004/0100431 A1    5/2004    Yoshida
2008/0198121 A1    8/2008    Park et al.
(Continued)

FOREIGN PATENT DOCUMENTS

CN        1746757 A    3/2006
CN     101118724 A    2/2008
(Continued)

*Primary Examiner* — Julia Slutsker
(74) *Attorney, Agent, or Firm* — Treyz Law Group, P.C.; G. Victor Treyz; Joseph F. Guihan

(57) ABSTRACT

A display may have an array of pixels. Display driver circuitry may supply data and control signals to the pixels. Each pixel may have seven transistors, a capacitor, and a light-emitting diode such as an organic light-emitting diode. The seven transistors may receive control signals using horizontal control lines. Each pixel may have first and second emission enable transistors that are coupled in series with a drive transistor and the light-emitting diode of that pixel. The first and second emission enable transistors may be coupled to a common control line or may be separately controlled so that on-bias stress can be effectively applied to the drive transistor. The display driver circuitry may have gate driver circuits that provide different gate line signals to different rows of pixels within the display. Different rows may also have different gate driver strengths and different supplemental gate line loading structures.

18 Claims, 18 Drawing Sheets

Related U.S. Application Data continuation of application No. 15/919,057, filed on Mar. 12, 2018, now Pat. No. 10,192,938, which is a continuation of application No. PCT/US2017/022808, filed on Mar. 16, 2017.

(60) Provisional application No. 62/314,281, filed on Mar. 28, 2016, provisional application No. 62/327,584, filed on Apr. 26, 2016.

(52) U.S. Cl.
CPC ........ *H01L 27/323* (2013.01); *H01L 27/3223* (2013.01); *G06F 3/044* (2013.01); *G09G 2300/0426* (2013.01); *G09G 2300/0809* (2013.01); *G09G 2310/0232* (2013.01); *G09G 2320/0223* (2013.01); *G09G 2320/0233* (2013.01); *H01L 2227/32* (2013.01)

(58) Field of Classification Search
CPC ............. H01L 2227/32; H01L 27/3276; H01L 27/3223; H01L 27/323
See application file for complete search history.

(56) References Cited

U.S. PATENT DOCUMENTS

| | | | |
|---|---|---|---|
| 2009/0102758 A1 | 4/2009 | Anzai et al. | |
| 2009/0102824 A1 | 4/2009 | Tanaka et al. | |
| 2009/0189835 A1 | 7/2009 | Kim et al. | |
| 2010/0141570 A1 | 6/2010 | Horiuchi et al. | |
| 2010/0289785 A1 | 11/2010 | Sawabe | |
| 2013/0063404 A1 | 3/2013 | Jamshidi Roudbari et al. | |
| 2014/0306985 A1 | 10/2014 | Jeong et al. | |
| 2015/0061981 A1 | 3/2015 | Lee et al. | |
| 2015/0219945 A1 | 8/2015 | Kimura | |
| 2015/0325593 A1 | 11/2015 | Shih et al. | |
| 2016/0035284 A1 | 2/2016 | Jung et al. | |
| 2016/0111040 A1 | 4/2016 | Kim et al. | |
| 2019/0304356 A1 | 10/2019 | Ka et al. | |

FOREIGN PATENT DOCUMENTS

| | | |
|---|---|---|
| CN | 101339733 A | 1/2009 |
| CN | 101401143 A | 4/2009 |
| CN | 101419349 A | 4/2009 |
| CN | 101536064 A | 9/2009 |
| CN | 101779227 A | 7/2010 |
| CN | 202583659 U | 12/2012 |
| CN | 104715719 A | 6/2015 |
| CN | 104732936 | 6/2015 |
| CN | 205081121 U | 3/2016 |
| EP | 2085952 A1 | 8/2009 |
| JP | 1659885 B2 | 3/2011 |
| KR | 100722113 B1 | 5/2007 |
| KR | 101588975 B1 | 1/2016 |
| KR | 20160000817 | 1/2016 |
| WO | 2007105700 | 9/2007 |
| WO | 2008062575 | 5/2008 |

LIGHT-EMITTING DIODE DISPLAYS

This is a continuation of U.S. patent application Ser. No. 16/224,607, filed Dec. 18, 2018, which is a continuation of U.S. patent application Ser. No. 15/919,057, filed Mar. 12, 2018, which is a continuation of International Application PCT/US2017/022808, with an international filing date of Mar. 16, 2017, which claims the benefit of U.S. Provisional Patent Application No. 62/314,281, filed Mar. 28, 2016, and U.S. Provisional Patent Application No. 62/327,584, filed Apr. 26, 2016, which are hereby incorporated by reference herein in their entireties.

BACKGROUND

This relates generally to displays, and, more particularly, to displays with pixels formed from light-emitting diodes.

Electronic devices often include displays. For example, cellular telephones and portable computers include displays for presenting information to users.

Displays such as organic light-emitting diode displays have arrays of pixels based on light-emitting diodes. In this type of display, each pixel includes a light-emitting diode and thin-film transistors for controlling application of a signal to the light-emitting diode to produce light. The thin-film transistors include drive transistors. Each drive transistor is coupled in series with a respective light-emitting diode and controls current flow through that light-emitting diode.

The threshold voltages of the drive transistors in an organic light-emitting diode display may vary due to operating history effects, which can lead to brightness nonuniformity. Brightness variations may also arise from control issues in displays with non-rectangular shapes. If care is not taken, effects such as these may adversely affect display performance.

SUMMARY

A display may have an array of pixels. Display driver circuitry may supply data and control signals to the pixels. Each pixel may have seven transistors, a capacitor, and a light-emitting diode such as an organic light-emitting diode or may have other thin-film transistor circuitry.

The transistors of each pixel may receive control signals using horizontal control lines. Each pixel may have first and second emission enable transistors that are coupled in series with a drive transistor and a light-emitting diode. The first and second emission enable transistors may be coupled to a common horizontal control line or may be separately controlled using separate control signals supplied over separate horizontal control lines. When the emission enable transistors of a pixel are individually controlled, on-bias stress can be effectively applied to the drive transistor of that pixel, because the source node of the drive transistor can be shorted to the positive power supply terminal of the pixel rather than floating.

Not all of the rows in a display may have the same number of pixels and may therefore be characterized by different amounts of capacitive loading. To ensure brightness uniformity for the display, the display driver circuitry may have gate drive circuits that provide different gate line signals to different rows of pixels within the display. This allows the display driver circuitry to generate row-location-dependent gate line signals to counteract variations in display brightness from different capacitive loading effects in different rows. Displays may also be provided with row-dependent supplemental gate line loading structures and/or gate drivers of different strengths in different rows to smooth out brightness variations.

DETAILED DESCRIPTION

Figure 1:
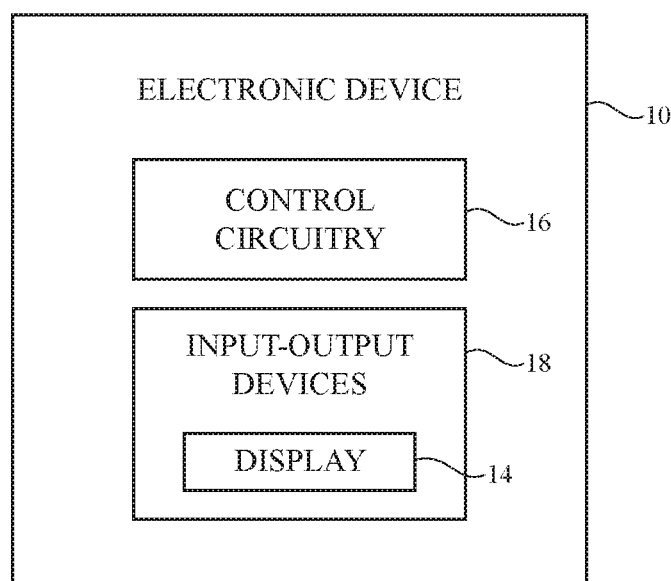
FIG. 1 is a schematic diagram of an illustrative electronic device having a display in accordance with an embodiment.

Electronic devices may be provided with displays. A schematic diagram of an illustrative electronic device with a display is shown in FIG. 1. Device 10 of FIG. 1 may be a computing device such as a laptop computer, a computer monitor containing an embedded computer, a tablet computer, a cellular telephone, a media player, or other handheld or portable electronic device, a smaller device such as a wrist-watch device (e.g., a watch with a wrist strap), a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 18 and may receive status information and other output from device 10 using the output resources of input-output devices 18.

Input-output devices 18 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14.

Display 14 may be an organic light-emitting diode display, a display formed from an array of discrete light-emitting diodes each formed from a crystalline semiconductor die, or any other suitable type of display. Configurations in which the pixels of display 14 include light-emitting diodes are sometimes described herein as an example. This is, however, merely illustrative. Any suitable type of display may be used for device 10, if desired.

Figure 2:
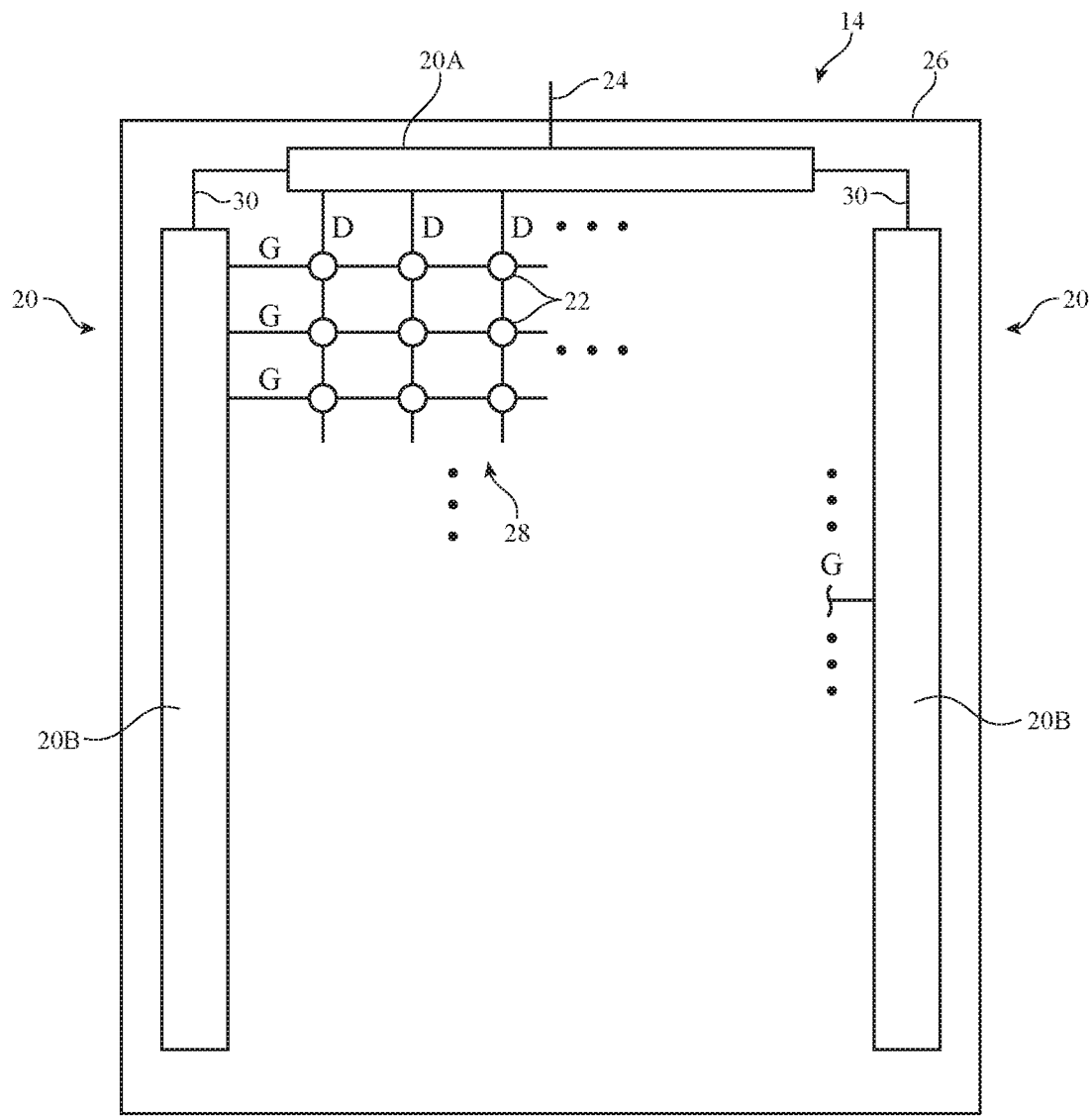
FIG. 2 is a schematic diagram of an illustrative display in accordance with an embodiment.

FIG. 2 is a diagram of an illustrative display. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, composite films that include polymer and inorganic materials, metallic foils, etc.

Display 14 may have an array of pixels 22 for displaying images for a user such as pixel array 28. Pixels 22 in array 28 may be arranged in rows and columns. The edges of array 28 may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels. If desired, a backlight unit may provide backlight illumination for display 14.

Display driver circuitry 20 may be used to control the operation of pixels 22. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 as shown in FIG. 2.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, the control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located along the bottom edge of display 14, at both the top and bottom of display 14, or in other portions of device 10.

To display the images on pixels 22, display driver circuitry 20A may supply corresponding image data to data lines D while issuing control signals to supporting display driver circuitry such as gate driver circuitry 20B over signal paths 30. With the illustrative arrangement of FIG. 2, data lines D run vertically through display 14 and are associated with respective columns of pixels 22.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally through display 14. Each gate line G is associated with a respective row of pixels 22. If desired, there may be multiple horizontal control lines such as gate lines G associated with each row of pixels (e.g., a first gate line signal GI and a second gate line signal GW, one or more emission control signals, etc.). Individually controlled and/or global signal paths in display 14 may also be used to distribute other signals (e.g., power supply signals, etc.).

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Figure 3:
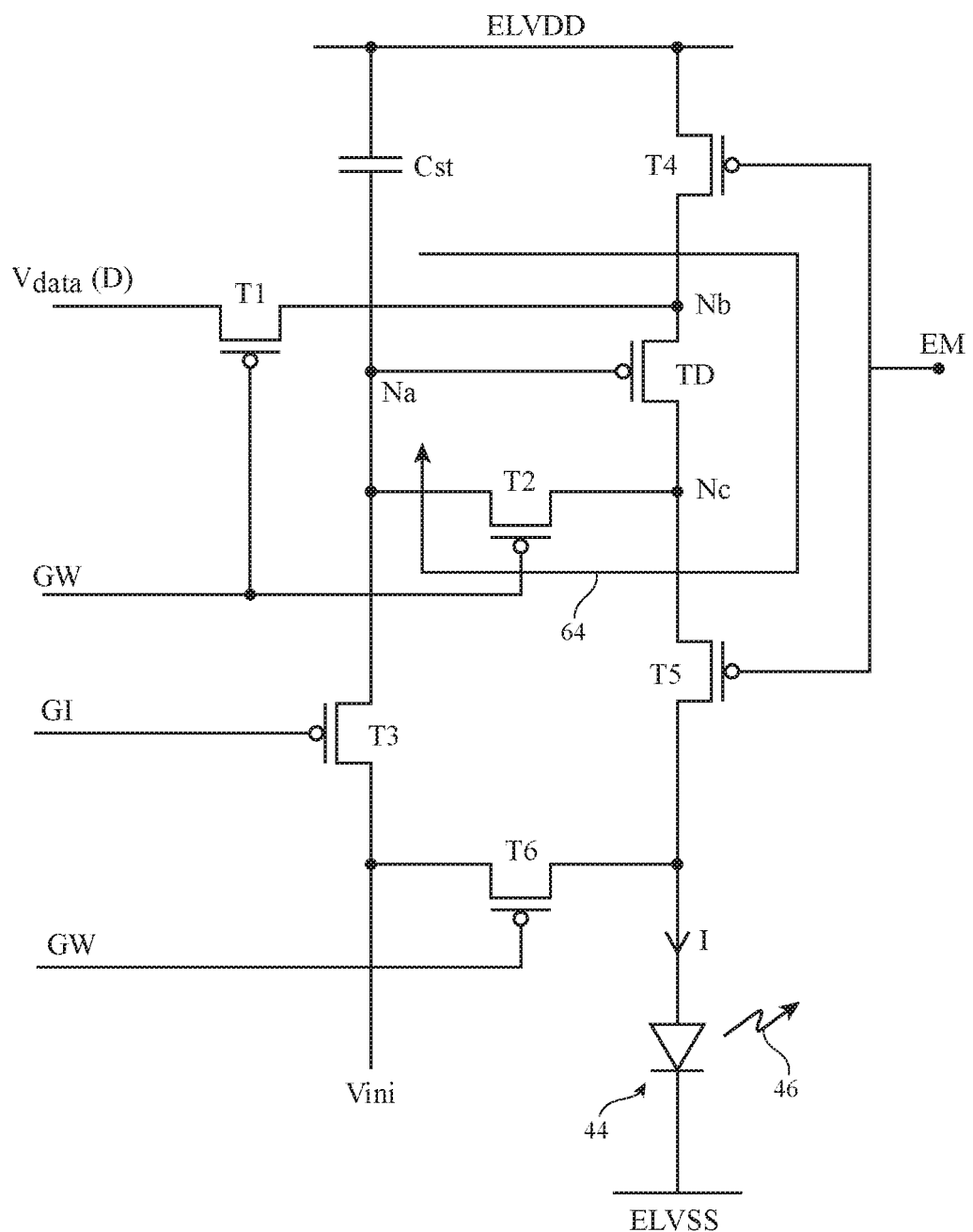
FIG. 3 is a diagram of an illustrative pixel circuit in accordance with an embodiment.

An illustrative pixel circuit of the type that may be used for each pixel 22 in array 28 is shown in FIG. 3. In the example of FIG. 3, pixel circuit 22 has seven transistors T1, T2, T3, T4, T5, T6, and TD and one capacitor Cst, so pixel circuit 22 may sometimes be referred to as a 7T1C pixel circuit. Other numbers of transistors and capacitors may be used in pixels 22 if desired (e.g., fewer transistors, more transistors, more capacitors, etc.). The transistors may be p-channel transistors (e.g., p-channel metal-oxide-semiconductor transistors as shown in FIG. 3) and/or may be n-channel transistors or other types of transistors. The active regions of thin-film transistors for pixel circuit 22 and other portions of display 14 may be formed from silicon (e.g., polysilicon channel regions), semiconducting oxides (e.g., indium gallium zinc oxide channel regions), or other suitable semiconductor thin-film layers.

As shown in FIG. 3, pixel circuit 22 includes light-emitting diode 44 (e.g., an organic light-emitting diode, a crystalline micro-light-emitting diode die, etc.). Light-emitting diode 44 may emit light 46 in proportion to the amount of current I that is driven through light-emitting diode 44 by transistor TD. Transistor TD, transistor T4, transistor T5, and light-emitting diode 44 may be coupled in series between respective power supply terminals (see, e.g., positive power supply terminal ELVDD and ground power supply terminal ELVSS). Transistor TD may have a source terminal coupled to node Nb, a drain terminal coupled to transistor T5, and a gate terminal coupled to node Na. The voltage on node Na at the gate of transistor TD controls the amount of current I that is produced by transistor TD. This current is driven through light-emitting diode 44, so transistor TD may sometimes be referred to as a drive transistor.

Transistors T4 and T5 can be turned off to interrupt current flow between transistor TD and diode 44 and transistors T4 and T5 may be turned on to enable current flow between transistor TD and diode 44. Emission enable control signal EM may be applied to the gates of transistors T4 and T5 from a shared gate line. During operation, transistors T4 and T5 are controlled by emission enable control signal EM and are therefore sometimes referred to as emission transistors or emission enable transistors. Control signals GW and GI which may sometimes be referred to as switching transistor control signals, scan signals, or gate line signals (e.g., gate initialization and gate write signals, gate signals, etc.), are applied to the gates of switching transistors T1, T2, T3, and T6 and control the operation of transistors T1, T2, T3, and T6.

Control signals EM, GI, and GW may be controlled by display driver circuitry 20 to place pixels 22 of display 14 in different states during the operation of display 14. During these different states, image data is loaded into pixels 22 and pixels 22 use light-emitting diodes 44 to emit light 46 in proportion to the loaded pixel data. To minimize threshold voltage variations due to differences in transistor history (e.g., historical Vgs values), each of the pixels can be conditioned by deliberately applying a known voltage stress to drive transistors TD (sometimes referred to as on-bias stress).

Figure 4:
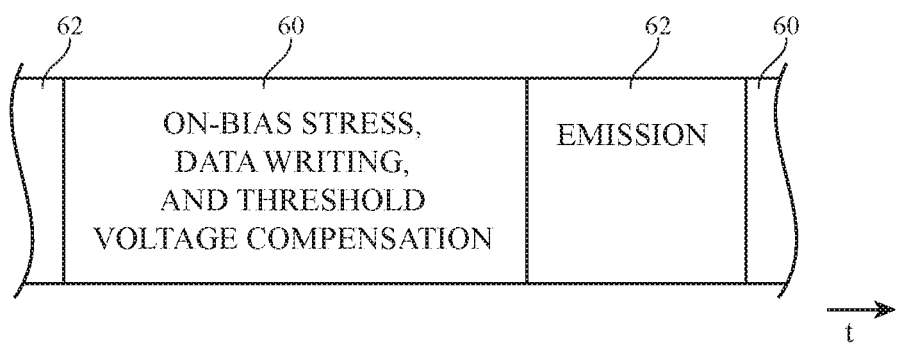
FIG. 4 is a timing diagram showing operations involved in using a pixel circuit of the type shown in FIG. 3 in a display in accordance with an embodiment.

As an example, display driver circuitry 20 may use control signals EM, GI, and GW to place pixels 22 in a first mode of operation (see, e.g., phase 60 of FIG. 4) before using pixels to emit light (in a second mode of operation such as phase 62 of FIG. 4). During operation, phases 60 and 62 can repeatedly alternate.

During phase 60, which may sometimes be referred to as a preconditioning phase or an on-bias stress, data writing, and threshold voltage compensation phase, on-bias stress may be applied to the drive transistor TD of each pixel 22 and data (D) from the data line may be loaded onto capacitor Cst (node Na) of that pixel 22. During phase 62, which may sometimes be referred to as an emission phase, drive transistor TD of each pixel 22 supplies drive current I to light-emitting diode 44 of that pixel, so that light-emitting diode 44 emits light 46. During phase 60, the data loaded onto capacitor Cst may be shifted from Vdata (the voltage on data line D) by an amount equal to the threshold voltage Vt of drive transistor TD, so that the drive current I of transistor TD is independent of Vt during emission phase 62 (i.e., the pixel circuit of FIG. 3 may be used to implement an internal threshold voltage compensation scheme).

Figure 5:
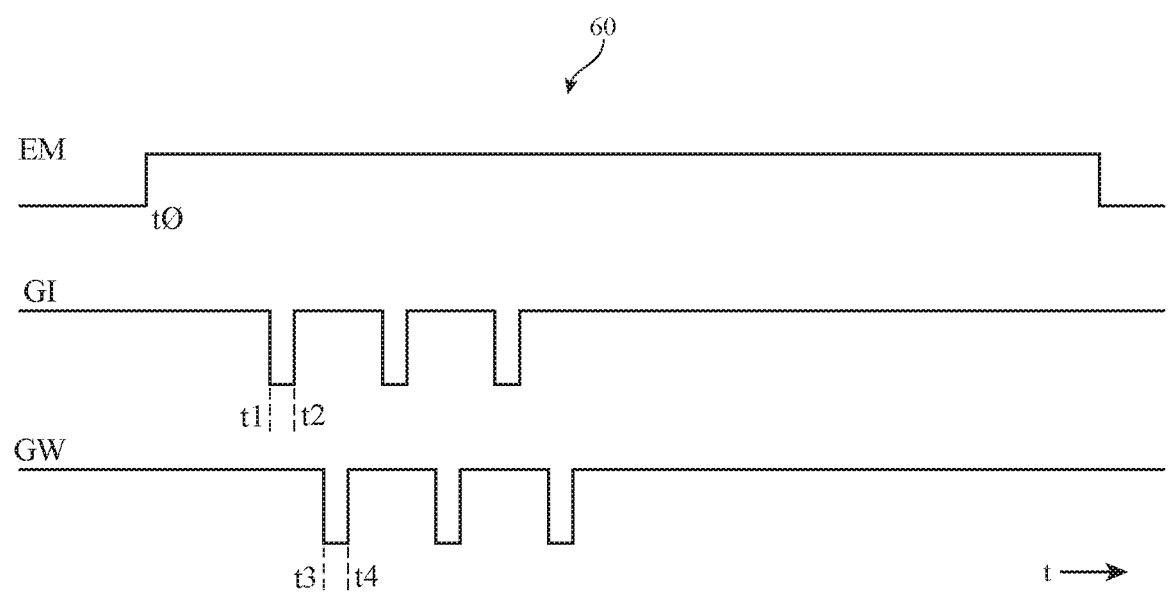
FIG. 5 is a diagram showing an illustrative emission enable control signal and illustrative gate lines signals for controlling switching transistors in a pixel of the type shown in FIG. 3 in accordance with an embodiment.

FIG. 5 shows illustrative signal traces for emission signal EM and gate line signals GI and GW of pixel 22 during phase 60.

As shown in FIG. 5, emission signal EM may be taken high at time t1 and held high during phase 60, thereby turning off transistors T4 and T5 and preventing current I from passing through light-emitting diode 44. With EM high, gate line signal GI may be taken low at time t1. This turns on transistor T3 and thereby places initialization voltage Vini (e.g., a low voltage signal such as −2 volts or other suitable voltage) onto node Na at the gate of drive transistor TD (i.e., a known on-bias stress is applied to drive transistor TD to precondition transistor TD and thereby help minimize threshold voltage variations in threshold voltage Vt of transistor TD due to the operating history of transistor TD). Transistor T3 may then be turned off at time t2 by taking signal GI high. At time t3, gate line signal GW may be taken low. This turns on transistors T1, T2, and TD, so that data (Vdata) from data line D is loaded onto node Na via path 64. If desired, the process of taking signals GI and GW low may be repeated (e.g., three times as shown in FIG. 5 or other suitable number of times) to help precondition transistor TD and satisfactorily load Vdata onto node Na.

In configurations for device 10 in which display 14 has the same number of pixels 22 in each row of display 14, the capacitive loading on the gate lines of display 14 will be relatively even across all of the rows of display 14. In other configurations for display 14 such as the illustrative configuration of FIG. 6, different rows of display 14 may contain different numbers of pixels 22. This may give rise to a row-dependent capacitive loading on the gate lines (e.g., the gate lines carrying signals such as signals GI and GW) that can affect the preconditioning operations and the data loaded onto node Na and therefore the resulting brightness of light 46 in the pixels 22 of each row.

Figure 6:
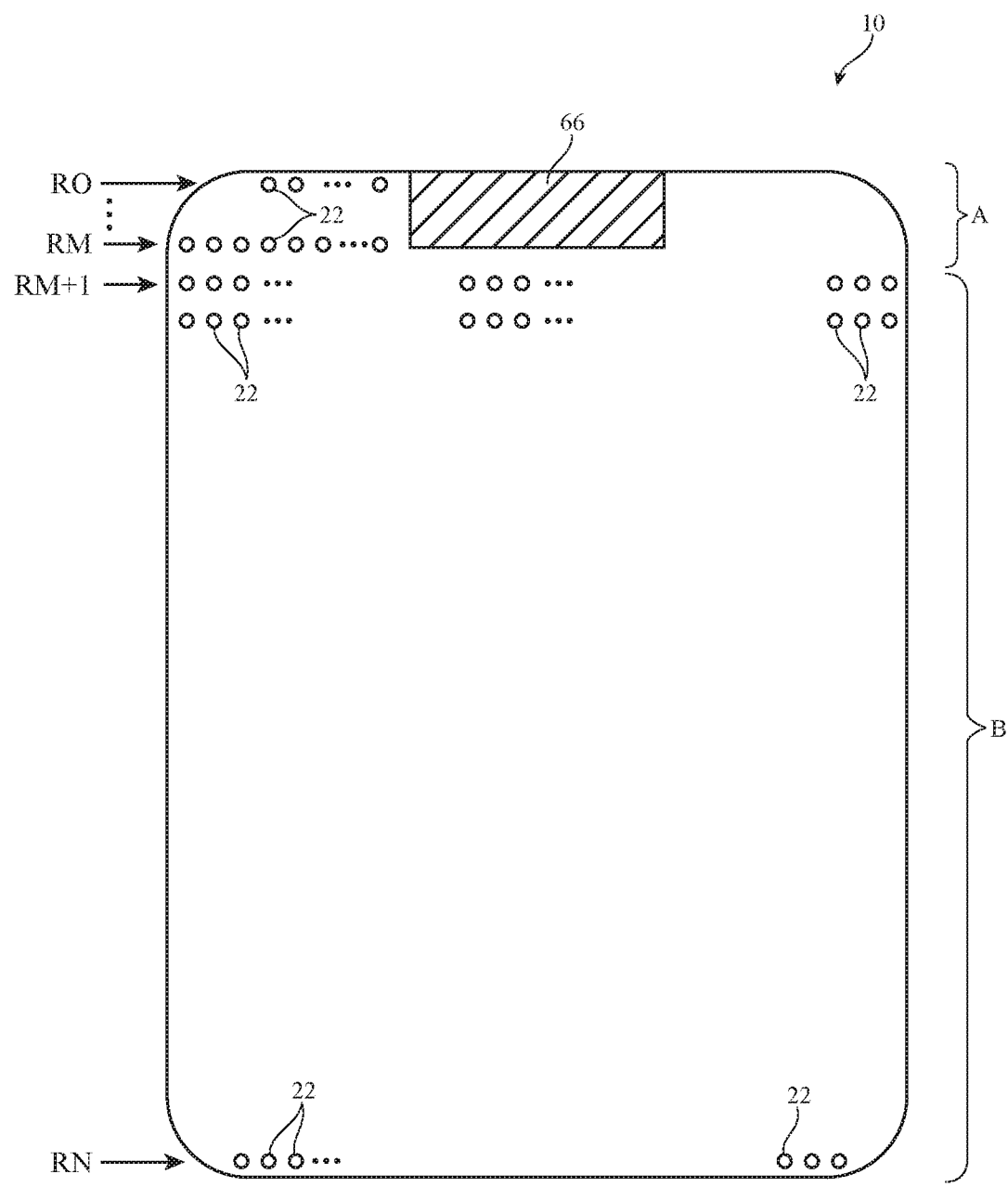
FIG. 6 is a diagram of an illustrative display that has a pixel-free notch along its upper edge and that therefore has different capacitive loading in different rows of the display in accordance with an embodiment.

In the illustrative arrangement of FIG. 6, display 14 has a rectangular shape with four curved corners and a recess (i.e., pixel-free notched region 66). The notch interrupts the rows of pixels 22 and creates short rows having fewer pixels than the normal-length rows that span the width of the substrate of display 14. Due to the curved corners of display 14, each row in the top and bottom edge of display 14 will have a slightly different amount of capacitive loading. Due to the gradually curved shape of the peripheral edge of display 14 at the top and bottom edges of display 14, the row-to-row change in the number of pixels 22 that load the gate lines will be gradual in these regions. As a result, luminance variations due to changes in row length (and therefore pixel count) between adjacent rows will be minimal and not noticeable to a viewer of display 14.

More abrupt shape changes such as the changes in display 14 due to notch 66 will introduce more significant changes in pixel loading on the gate lines. Rows such as row RM+1 . . . RN in display 14 of FIG. 6 have pixel counts that are equal (or, in the case of the rows at near the bottom edge of display 14, are nearly equal) to each other. Rows such as rows R0 . . . RM will have pixel counts that are less than half of the pixel counts of rows RM+1 . . . RN. This is because each gate line in rows R0 . . . RM will only extend to the left or right boundary of region 66 and will not be able to traverse region 66.

Because the gate lines in area A of display 14 (i.e., the gate lines of rows R0 . . . RM in the top edge of display 14 adjacent to region 66) and the gate lines in area B of display 14 (i.e., the gate lines of rows RM+1 . . . RN) experience different amounts of loading in the example of FIG. 6, there is a risk that pixels 22 in areas A and B will be loaded with different voltages on their storage capacitors Cst, even in the presence of identical Vdata values on their data lines. To compensate for these row-dependent gate line loading effects, display driver circuitry 20 can create gate line signals G that vary as a function of row. For example, display driver circuitry 20 can produce gate line signals for the rows in area A that have shorter pulse widths than the gate lines signals for the rows in area B. The gate line signals with shorter pulse widths that are used in area A will then load the pixels in area A in the same way that the gate line signals with longer pulse widths that are used in area B will load the pixels in area B.

Figure 7:
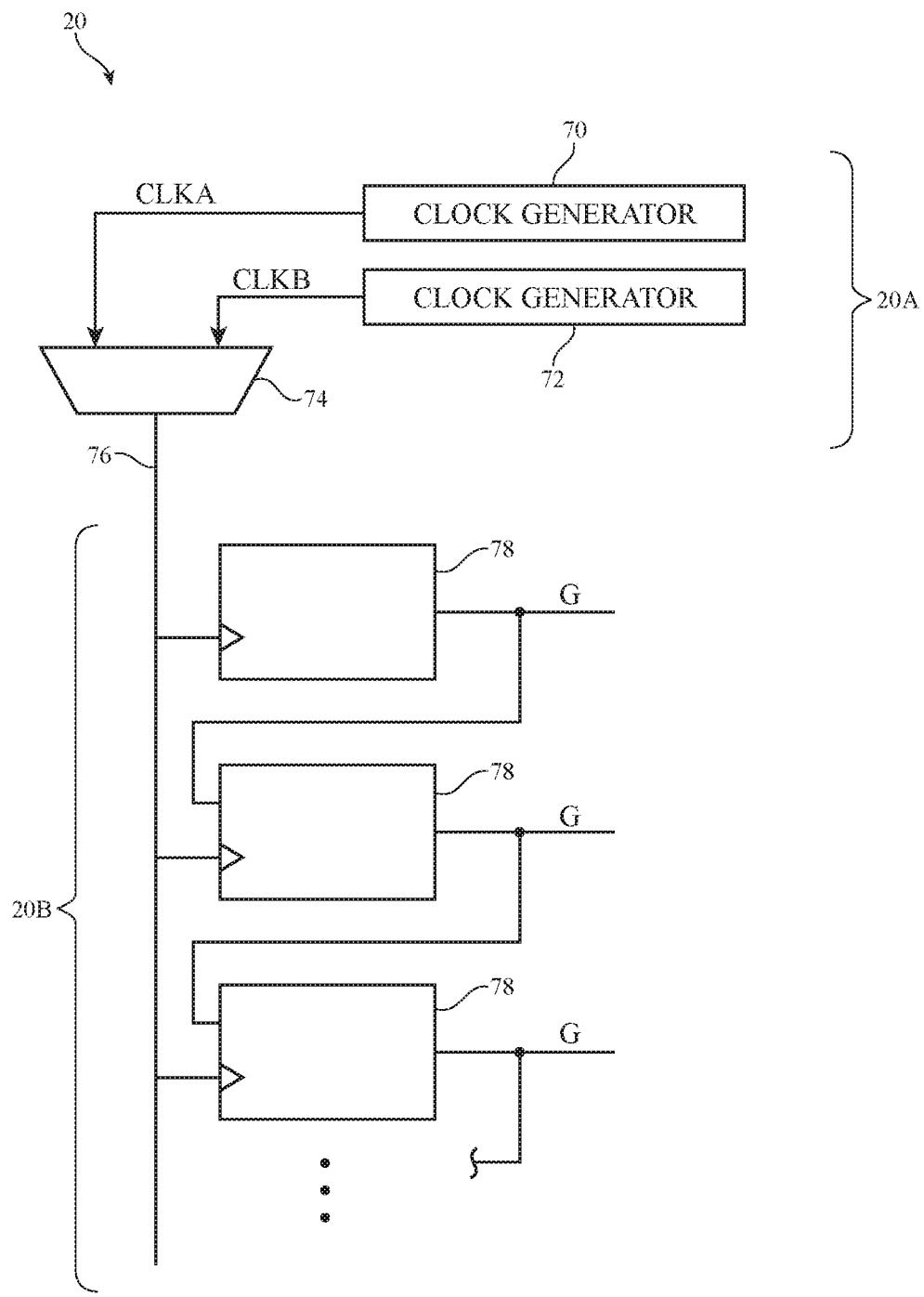
FIG. 7 is a diagram of display driver circuitry of the type that may be used to provide different rows of pixels with different gate line signals to counteract for different capacitive loading effects in different rows in accordance with an embodiment.

Illustrative display driver circuitry for providing the rows of pixels 22 in area A with different gate signals than the rows of pixels 22 in area B is shown in FIG. 6. As shown in FIG. 7, display driver circuitry 20A (e.g., an integrated circuit, thin-film transistor circuitry, etc.) may include clock generators such as clock generators 70 and 72 that produce different clock signals (e.g., clock signals that different in pulse width, pulse slew rate, and/or other attributes). These signals may be provided to the clock inputs of gate driver circuits 78 of gate driver circuitry 20B via multiplexer 74 and clock distribution path 76. The output G of each gate driver circuit 78 may be provided to a subsequent gate driver circuit 78 to form a shift register. In the example of FIG. 7, each gate driver circuit produces a gate signal for a respective row of pixels 22. If desired, circuitry 20B may produce multiple gate line output signals (e.g., signals GI and GW) for each row. The shift register formed from circuits 78 allows a gate line signal (or gate line signals when each circuit 78 has multiple outputs corresponding to multiple gate lines in each row) to be asserted in each row of display 14 in sequence.

The clock signals from line 76 are distributed to the clock inputs of each gate driver circuit 78, which then use these clocks in producing corresponding output signals G. The shape of the clock signal on line 76 when a given gate line signal is being produced can be used to control the shape of the given gate line signal. In particular, clock signal attributes (e.g., pulse width) for the clock signals on line 76 affect gate line signal attributes (e.g., pulse width), so changes to clock signals on path 76 can be used in controlling gate line signals G.

When it is desired to supply a first type of clock signal to gate driver circuits 78 of gate driver circuitry 20B (e.g., when producing gate line signals for the pixels in area A), display driver circuitry 20A may configure multiplexer 74 so that output CLKA of clock generator 70 is routed to gate driver circuits 78 in circuitry 20A via path 76. When it is desired to supply a second type of clock signal to gate driver circuits 78 of gate driver circuitry 20B (e.g., when producing gate line signals for the pixels in area B), display driver circuitry 20A may configure multiplexer 74 so that output CLKB of clock generator 72 is routed to gate driver circuits 78 in circuitry 20A via path 76. During each frame of image data, multiplexer 74 may be placed in its first state (coupling clock generator 70 to path 76) during the rows of area A and may be placed in its second state (coupling clock generator 72 to path 76) during the rows of area B.

Figure 8:
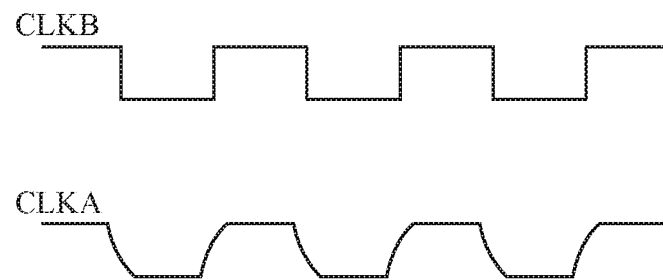
FIGS. 8, 9, and 10 each show first and second illustrative gate line signals to be provided respectively to first and second sets of rows in a display that are characterized by respective first and second different capacitive loading effects in accordance with an embodiment.
Figure 9:
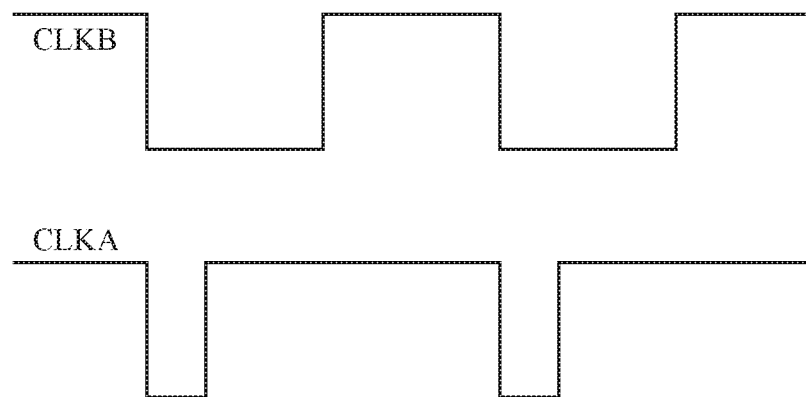
Figure 10:
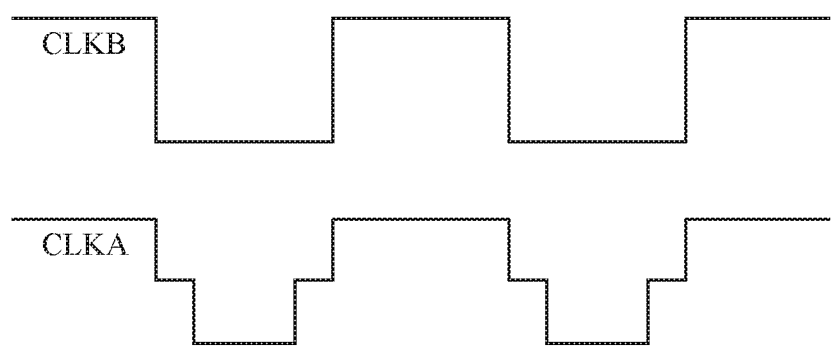

FIGS. 8, 9, and 10 show illustrative signals CLKB and CLKA of the type that may be provided to respective areas B and A to reduce luminance variations between areas B and A. In the example of FIG. 8, the slew rate of clocks CLKB and CLKA are different. There is a parasitic capacitance between the gate of transistor T2 and node Na that allows faster slew rate signals such as the CLKB signal to pass more data from data line D onto node Na than slower slew rate signals such as the CLKA signal. By using faster slew rate signal CLKB in region B (where gate lines are more heavily loaded by pixels 22) and using slower slew rate signal CLKA in region A (where gate lines are less heavily loaded by pixels 22), data signals Vdata will be uniformly loaded onto nodes Na in regions A and B, thereby reducing undesired pixel brightness variations between regions A and B. In the example of FIG. 9, the pulse width (pulse duration) of signal CLKA is smaller than the pulse width (pulse duration) of signal CLKB. The longer pulse width of CLKB, which is used in region B, helps compensate for the additional loading on the gate lines in the rows of pixels in region B. In the example of FIG. 10, clock signals CLKA have a two-step profile that provides the pulses of CLKA with a shorter pulse shape and slower slew rate than CLKB (which has a one-step profile) to help compensate for the additional loading on the gate lines in the rows of pixels in region B relative to region A. The examples of FIGS. 8, 9, and 10 are examples of signal profiles that may be used for clocks CLKA and CLKB (and therefore the gate line signals G that are supplied to pixels 22 in respective areas A and B of display 14). Other types of signals and other combinations of signals CLKA and CLKB may be used, if desired.

Figure 11:
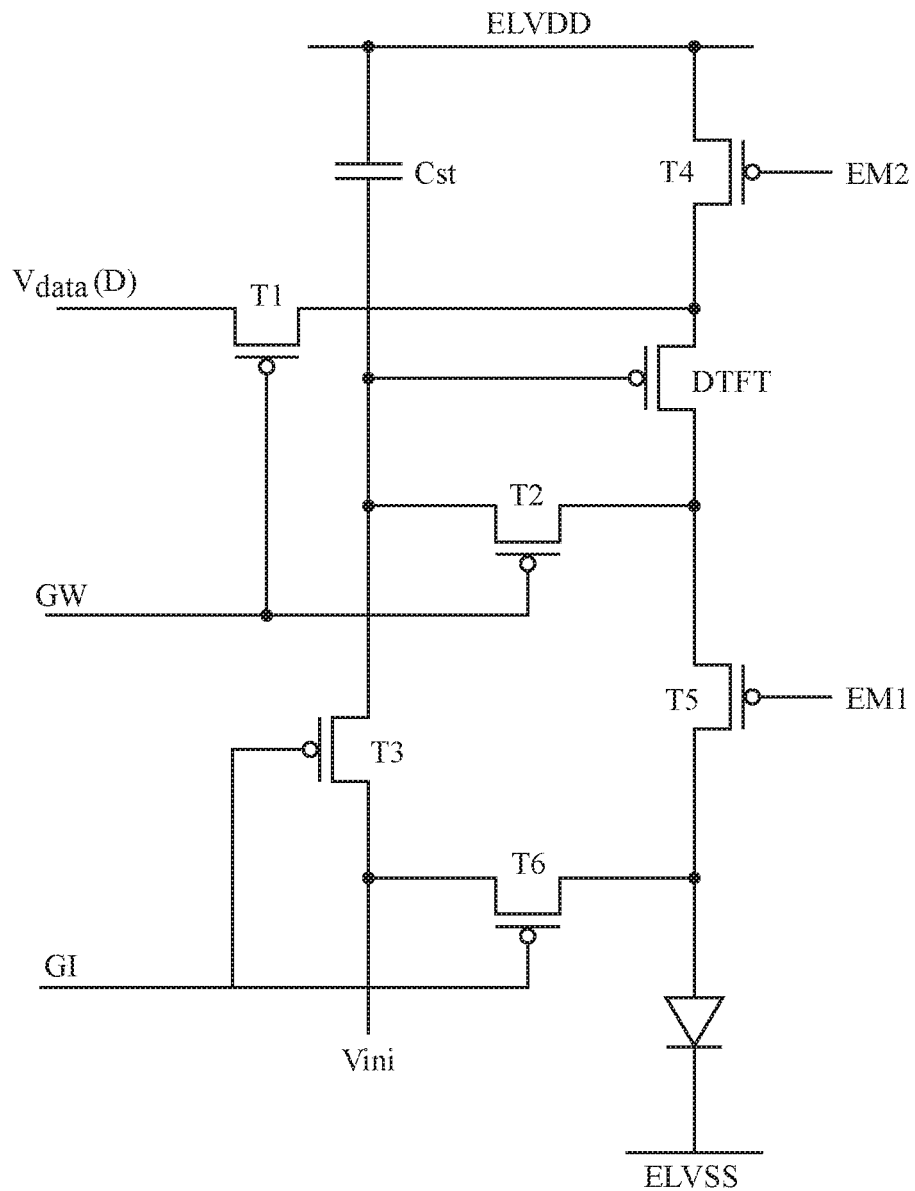
FIG. 11 is a diagram of an illustrative pixel circuit having individually controlled emission enable transistors in accordance with an embodiment.
Figure 12:
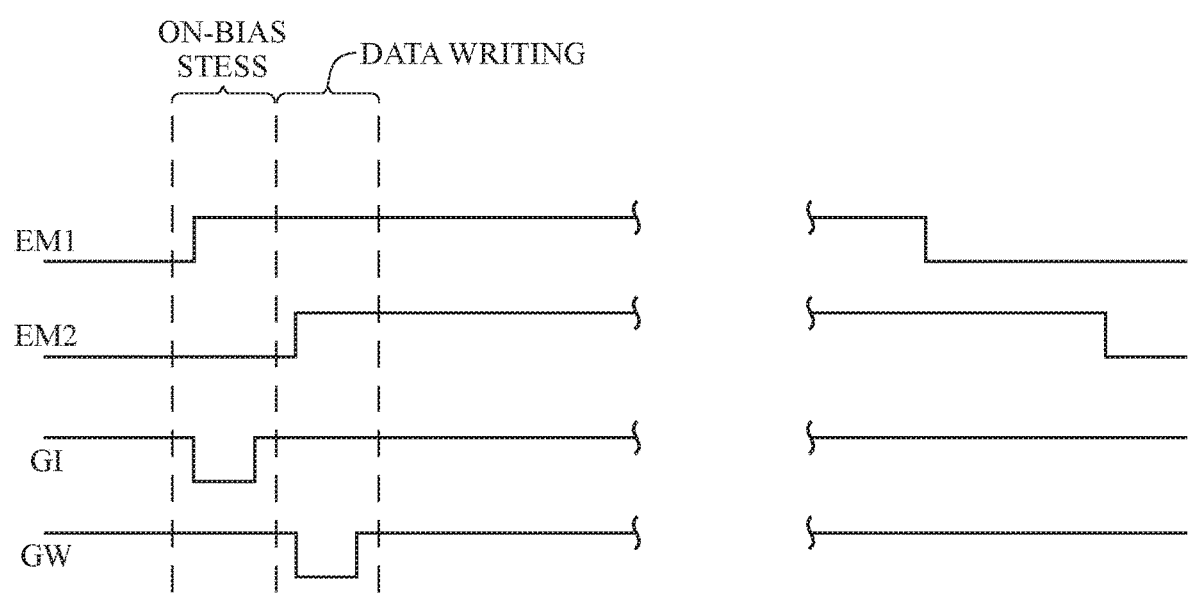
FIG. 12 is a timing diagram showing how on-bias stress can be applied to the pixels in a display and showing how data writing operations may be performed in accordance with an embodiment.

To enhance the effectiveness of the application of the known on-bias stress to drive transistor TD, it may be desirable to separate emission signal EM into two respective independently controlled emission signals EM1 and EM2, as shown in the illustrative pixel circuit for pixel 22 of FIG. 11. In the example of FIG. 11, emission control signal (emission enable signal) EM2 is used in controlling emission transistor T4 and emission control signal (emission enable signal) EM1 is used in controlling emission transistor T5. In arrangements of the type shown by pixel circuit 22 of FIG. 3, emission signal EM is high during on-bias stress operations in which voltage Vini is being driven onto node Na via transistor T3. Because EM is high, transistor T4 of FIG. 3 is off during the on-bias stress operations of phase 60 and the voltage on node Nb at the source of transistor TD of FIG. 3 can float and thereby reduce the Vgs voltage across drive transistor TD. In contrast, signal EM2 of FIG. 11 may be held low during on-bias stress operations to turn transistor T4 on and thereby hold node Nb (the source of transistor TD) high at positive power supply voltage ELVDD to effectively apply a large gate-source voltage Vgs to drive transistor TD. This is shown in FIG. 12, which shows how EM1 is high and EM2 is low when GI is taken low during on-bias stress phase.

If desired, display driver circuitry 20 may supply row-dependent gate line signals to pixels 22 to reduce row-to-row luminance variation in a display whose pixels have commonly controlled emission control transistors (see, e.g., pixels 22 of FIG. 3) or whose pixels have independently controlled emission transistors.

The amount of charge (signal Vdata) that is loaded onto node Na of each pixel 22 from data line D is dependent on the characteristics of the gate line signals for that pixel. During data loading operations, gate line signal GW (i.e., the third GW pulse in FIG. 5) is asserted (taken low in the example of FIG. 5) to load data from data line D onto node Na through transistors T1, TD, and T2. Due to the parasitic capacitance (Cgs) of transistor T3 of FIG. 3, signals GW with faster slew rates and longer pulse durations tend to load more of voltage Vdata onto node Na than signals GW with slower slew rates and shorter durations.

Gate line loading affects the shape of the gate line pulses on the gate lines and can therefore affect pixel brightness. Gate lines with larger amounts of gate line loading will tend to be dimmer than gate lines with smaller amounts of gate line loading. Rows in display 14 can be provided with different amounts of gate line loading to help reduce brightness variations. These gate line loading adjustments may made in addition to and/or instead of using techniques in which the shape of the gate line pluses that are provided to the rows of pixels in display 14 are adjusted to reduce row dependent brightness variations as described in connection with FIGS. 8, 9, and 10. As an example, shorter rows that have fewer pixels can be provided with supplemental loads (sometimes referred to as dummy loads or supplemental gate line loading structures) to help make those rows behave similarly to or identically to longer rows in the display.

Figure 13:
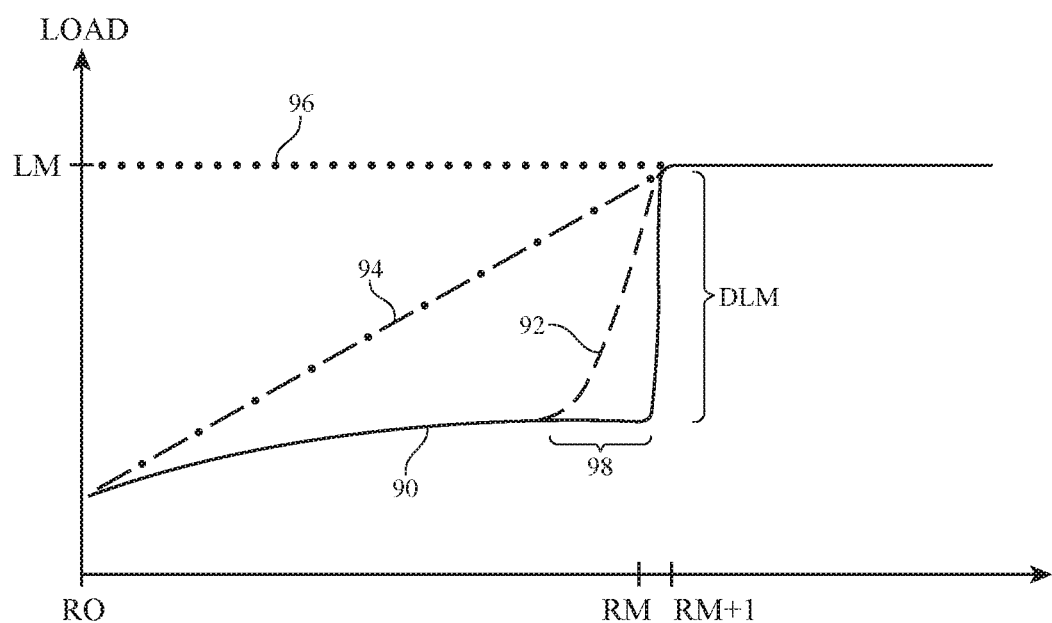
FIG. 13 is a graph showing how gate line loading may be adjusted as a function of row position in a display to help minimize display brightness variations in accordance with an embodiment.

A graph illustrating the impact of various loading schemes that may be used to help smooth out brightness variations in a display having rows of pixels of unequal lengths (different numbers of pixels) is shown in FIG. 13. In the example of FIG. 13, gate line loading (LOAD) has been plotted as a function of row number, for the upper portion of display 14 starting at row R0 of FIG. 6). Solid line 90 corresponds to a display of the type shown in FIG. 6 without any supplemental loading structures. Rows less than row RM (i.e., rows in area A of FIG. 6) experience gradually increasing amounts of loading. After row RM (i.e., in area B), loading reaches load value LM. With an uncompensated display configuration (solid line 90), there may be a relatively sharp discontinuity (loading difference DLM) in the amount of loading experience by the gate lines of respective rows RM and row RM+1. This discontinuity can lead to a noticeable variation between the brightness of the pixels in row RM and the brightness of the pixels in row RM+1. For example, if the load varies by more than 10% between successive rows, the brightness of the pixels in the successive rows may vary by more than 10% or other visible amount.

Brightness variations such as these can be smoothed out by adding supplemental gate line loading structures to appropriate rows of display 14 (e.g., those rows that would otherwise be underloaded due to a lack of pixels on the gate lines of those rows). For example, brightness variations between a first area of the display in which gate lines are coupled to a given number of pixels and a second area of the display in which gate lines are coupled to fewer than the given number of pixels can be reduced to less than a 10% brightness variation, less than a 20% brightness variation, a brightness variation that is less than 50%, less than 15%, less than 5%, less than 2%, less than 1%, or less than other suitable brightness variation values). With one illustrative arrangement, which is illustrated by line 92, gate line loading is smoothed out by adding supplemental loads to the gate lines of rows 98. If desired, further smoothing may be achieved (e.g., by adding varying amounts of load to each of the gate lines of rows R0 through RM, as illustrate by line 94). If desired, gate lines in rows R0-RM may be compensated by adding sufficient supplemental gate line loading to equalize the loading on the gate lines of all of the rows in display 14 (see, e.g., illustrative loading line 96 of FIG. 13). In general, any suitable amount of supplemental loading may be added to appropriate rows of display 14. Supplemental loads may be significant (e.g., to completely equalize loading for all rows as illustrated by line 96), may be moderate (e.g., to smooth loading as shown by line 94), or may be relatively small (e.g., to help smooth out the load discontinuity at rows RM/RM+1 by adding loading to a relatively modest number of rows (e.g., rows 98), as illustrated by line 92. Any of these schemes may also be combined with row-dependent gate signal shaping schemes of the types described in connection with FIGS. 8, 9, and 10 and/or other display brightness smoothing arrangements (which may also extend over any suitable number of rows in display 14 to help smooth out brightness discontinuities).

Illustrative arrangements for adding supplemental loads to the gate lines of appropriate rows of display 14 are shown in FIGS. 14-25.

Figure 14:
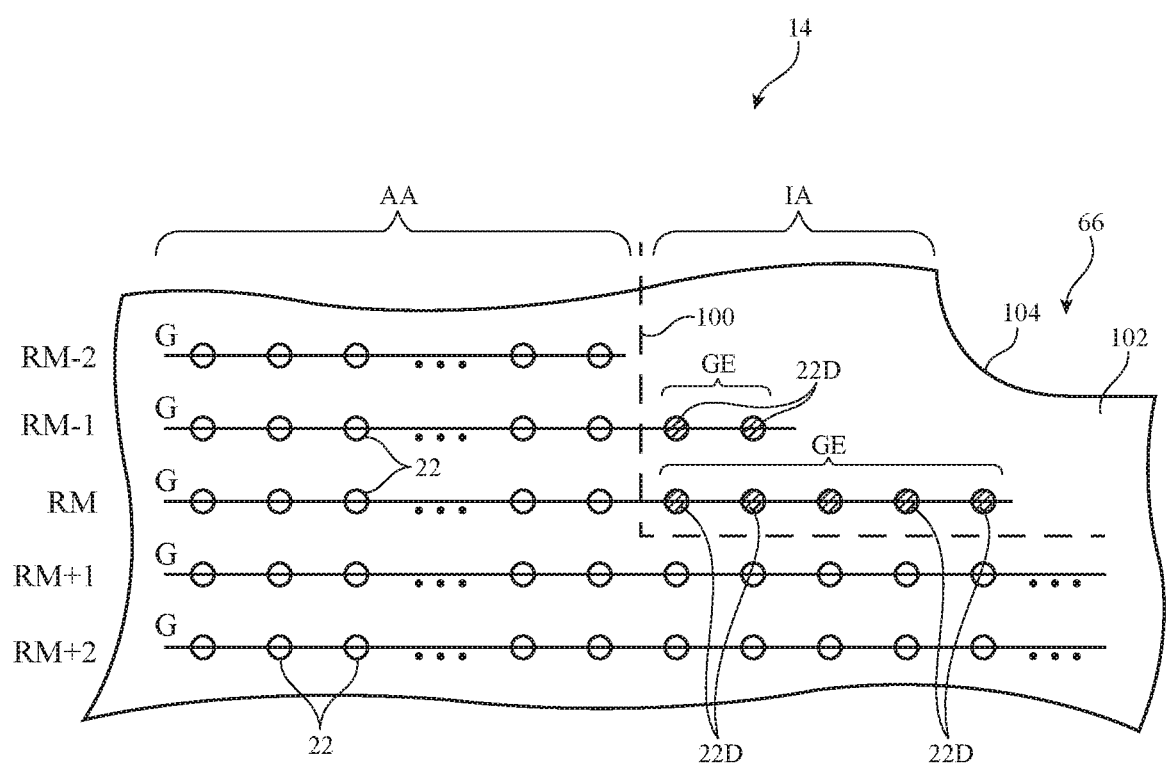
FIG. 14 is a diagram showing how supplemental data line loading structures such as dummy pixel structures may be added to rows in a display to even out brightness variations in accordance with an embodiment.

As shown in the illustrative configuration of FIG. 14, selected gate lines G (e.g., gate lines GI and/or GW of FIG. 3 or other suitable gate lines) may be provided with extended portions such as gate line extensions GE that are coupled to supplemental loading structures (supplemental gate line loading structures) such as dummy pixels 22D. Display 14 of FIG. 14 has a notch or other pixel-free area such as pixel-free notch 66. Display 14 may have one or more substrate layers such as substrate 102. Substrate 102 may have an edge such as edge 104. Edge 104 may be straight or curved (as in the example of FIG. 14). A narrow border portion of substrate 102 adjacent to the display notch (i.e., inactive area IA) is free of pixels 22, but may contain supplemental gate line loading structures such as dummy pixels 22D. In FIG. 14, inactive area IA is separated from active area AA (which contains active pixels 22) by dashed line 100. To ensure that dummy pixels 22D do not encroach too far into inactive area IA (i.e., to ensure that dummy pixels 22D are not too close to edge 104 of substrate 102), the layout of dummy pixels 22D may accommodate curved edge 104. To smoothly transition between the large amount of loading experienced by gate lines G in rows RM+1 (sometimes referred to as long rows) and the smaller amount of loading experienced by gate lines G in rows R0-RM (sometimes referred to as short rows), a relatively large amount of supplemental loading may be supplied in row RM (e.g., four dummy pixels 22D in the FIG. 14 example) and progressively smaller amounts of supplemental loading may be supplied in rows that are progressively farther from row RM (e.g., two supplemental dummy pixels 22D may be coupled to a gate line in row RM-1 in the FIG. 14 example, etc.). In the illustrative configuration of FIG. 14, only two rows (RM and RM-1 have been supplied with supplemental loading, but, in general, any suitable number of rows may be supplied with supplemental loading (e.g., 2-20 rows, 2-100 rows, 50-1000 rows, more than 25 rows, fewer than 2000 rows, etc.). Any suitable number of dummy pixels 22D (e.g., 1-1000, more than 10, fewer than 500, etc.) may be coupled to the gate line GW in each row of display 14 (see, e.g., gate line GW of FIG. 3) and/or may be coupled to other suitable horizontal control lines in display 14 to reduce row-dependent brightness variations.

Dummy pixels 22D may contain all of the pixel circuitry of regular pixels 22 with small but critical modifications that prevent these pixels from emitting light. Examples of modifications that may be made to convert active pixels 22 into dummy pixels 22D include: omitting the emissive material of pixels 22 from pixels 22D, omitting the anodes of pixels 22D, omitting small portions of metal traces coupling the thin-film transistor circuitry in pixels 22D to the light-emitting diodes in pixels 22D to create open circuits, etc. The footprint (outline when viewed from above) of each of pixels 22D of FIG. 14 may be the same as the footprint of each of pixels 22.

Figure 15:
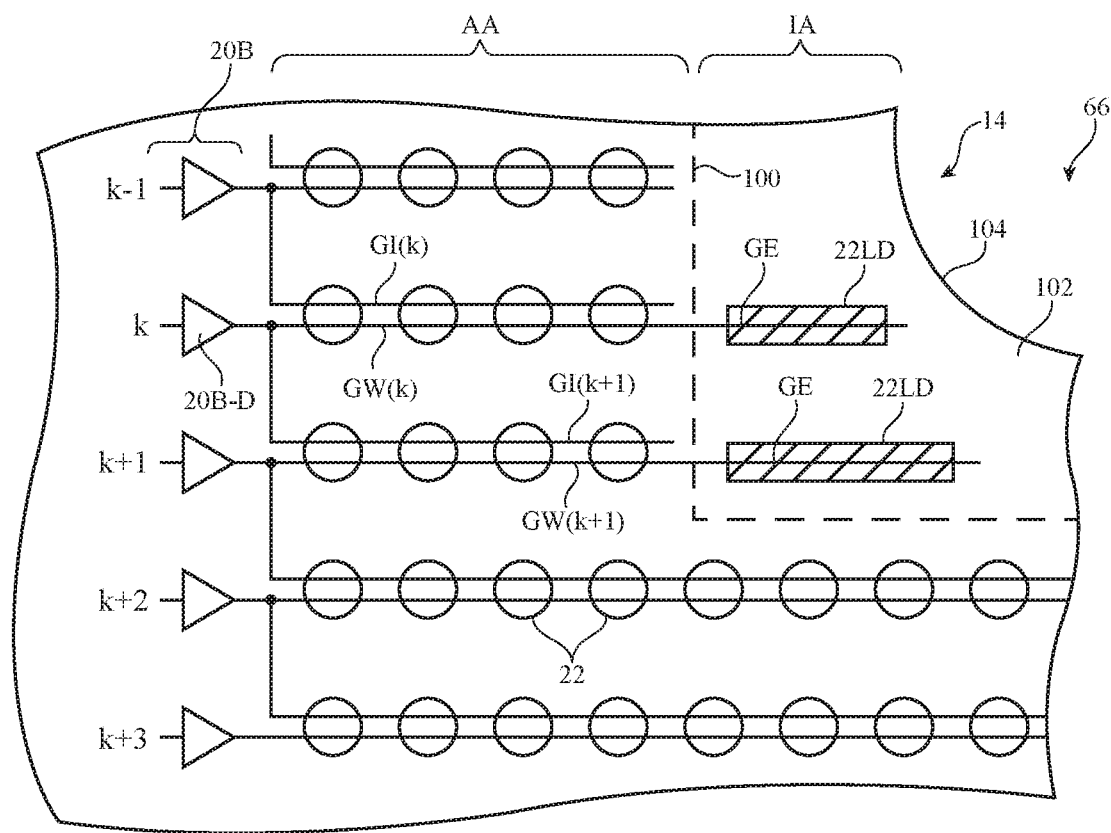
FIG. 15 is a diagram showing how different amounts of supplemental gate line loading structures may be added to rows in a display to even out brightness variations in accordance with an embodiment.

If desired, supplemental loading structures formed from capacitors may be used. This type of arrangement is shown in FIG. 15. In the example of FIG. 15, supplemental loads 22LD have been provided in rows k and k+1 to help smooth out a loading discontinuity between rows k+1 and k+2. The circuit diagram in FIG. 15 shows how gate line signals on gate lines GI and GW may be produced by the same gate drivers in gate driver circuitry 20B. For example, gate line signal GI(k+1) may be produced by coupling the GI line in row k+1 to the output of the gate driver 20B-D for gate line GW in row k (i.e., GI(k+1)=GW(k)). Supplemental gate line loading structures (supplemental gate line loads) 22LD may be coupled to both gate line GI and to gate line GW in each row or may, as shown in FIG. 15, be coupled to only a single gate line (i.e., gate line GW) in each row to reduce the area consumed by the gate lines extensions GE.

Figure 16:
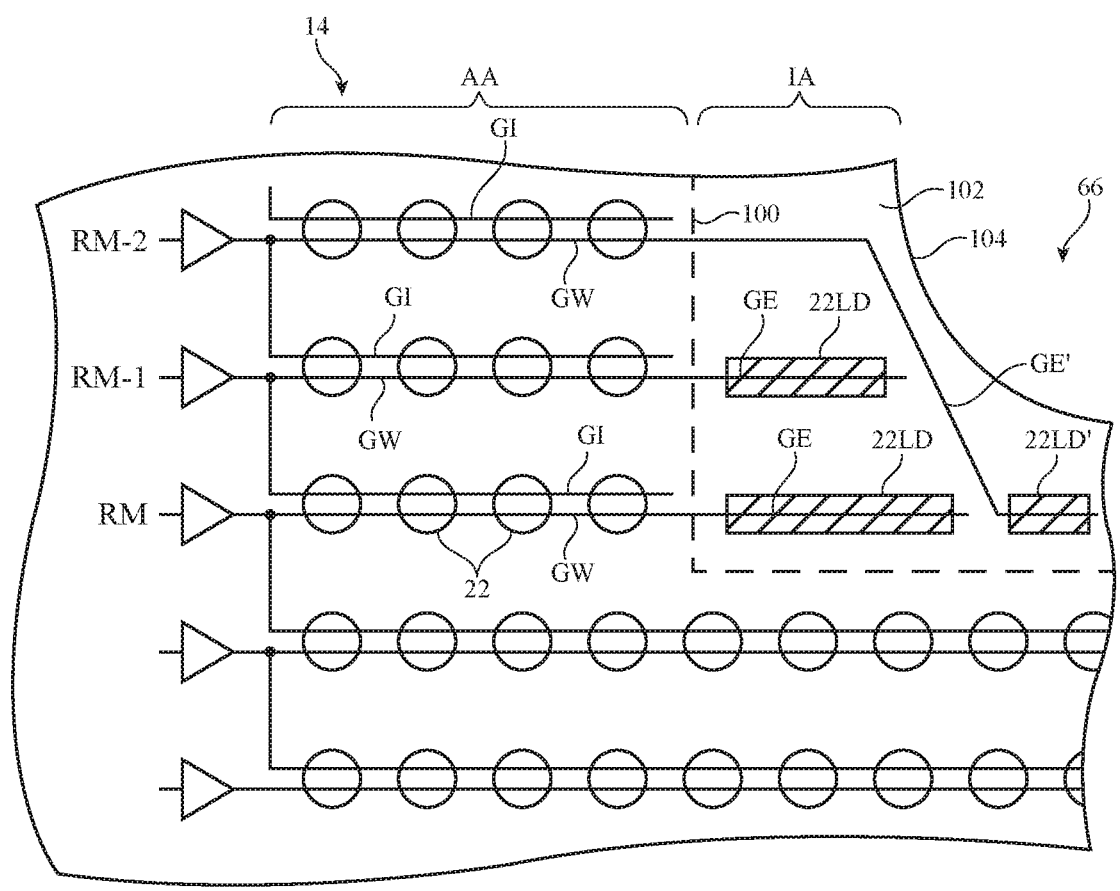
FIG. 16 is a diagram showing how gate line loading structures that are located in one row of a display may be used to increase gate line loading in another row in accordance with an embodiment.

In the example of FIG. 15, each supplemental load 22LD is located in the same row as the gate line to which it is coupled. If desired, gate line extensions GE may have bent portions such as portions GE' of FIG. 16 that span multiple rows. This allows some of the loading structures to be located in rows other than the gate lines to which they are coupled. In the arrangement of FIG. 16, for example, supplemental loading structure 22LD' is located in row RM, but is coupled to gate line GW in row RM-2 using gate line extension GE. This type of arrangement may be used to help optimize the placement of supplemental loading structures (e.g., so that more supplemental loading structures may be incorporated into border IA without locating these structures too close to substrate edge 104 or excessively increasing the size of border IA).

Figure 17:
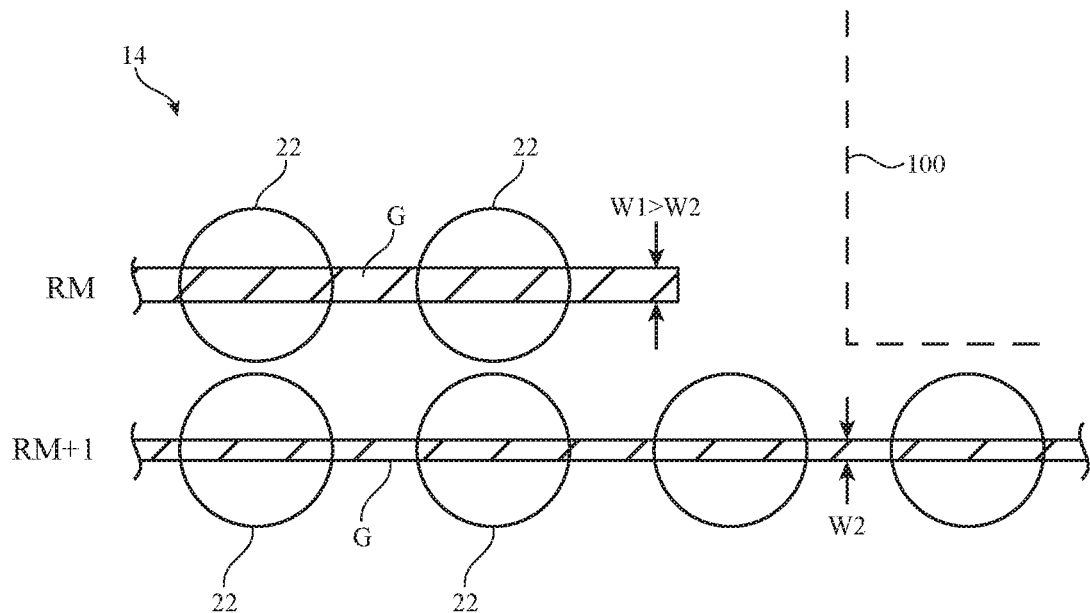
FIG. 17 is a diagram of a portion of a display showing how row-dependent supplemental gate line loading structures may be implemented by increasing gate line width for short rows as a function of row position in accordance with an embodiment.

Illustrative display 14 of FIG. 17 includes gate lines of different widths in different rows. Long row RM+1 has a normally sized gate line G (i.e., a gate line of width W2). Short rows may be provided with appropriately enlarged gate lines to enhance loading. For example, a supplemental loading structure may be formed for row RM by increasing the width of gate line G in row RM to a value W1 that is larger than W2. The additional capacitance provided by enhancing the width of gate line G allows the additional width to serve as a supplemental gate line loading structure.

Figure 18:
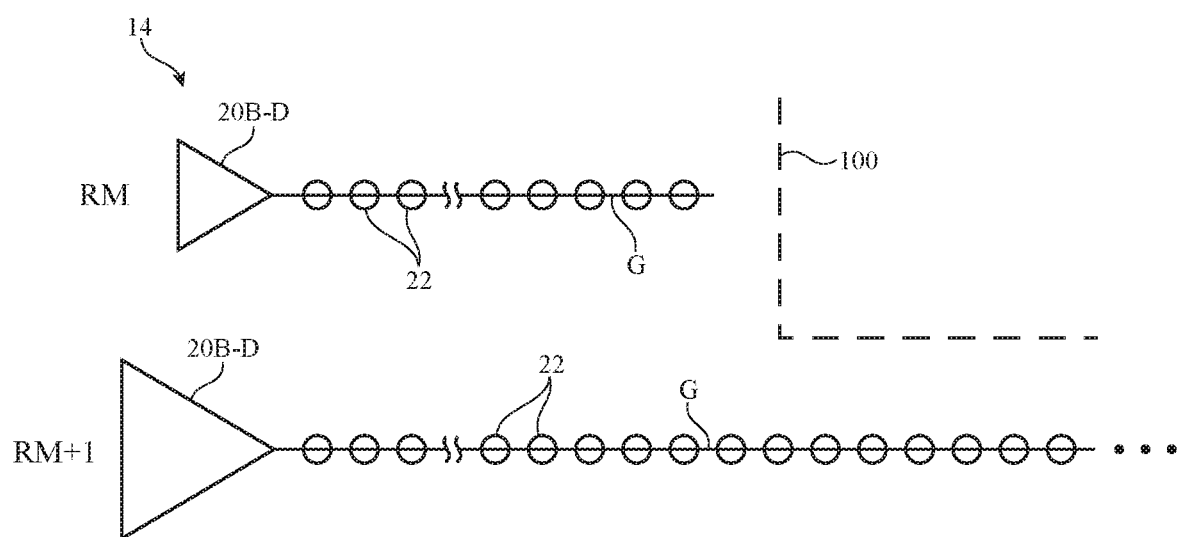
FIG. 18 is a diagram of a portion of a display showing how gate driver strength may be varied as a function of row position in accordance with an embodiment.

FIG. 18 shows how gate drivers such as gate drivers 20B-D may be varied in strength to compensate for rows with different numbers of pixels. For example, output buffers (gate drivers) 20B-D in normal (long) rows such as row RM+1 may have transistors of normal sizes so that the output buffers drive gate lines signals onto gate lines G with normal strength, whereas output buffers 20B-D in short rows such as row RM may have reduced strengths (e.g., transistors that are smaller and therefore weaker than the transistors in the gate drivers of the long rows). Row-dependent gate driver strength adjustments may be made in combination with one or more other brightness discontinuity smoothing arrangements (e.g., supplemental loading structures, gate line signal slew rate modifications, etc.).

Figure 19:
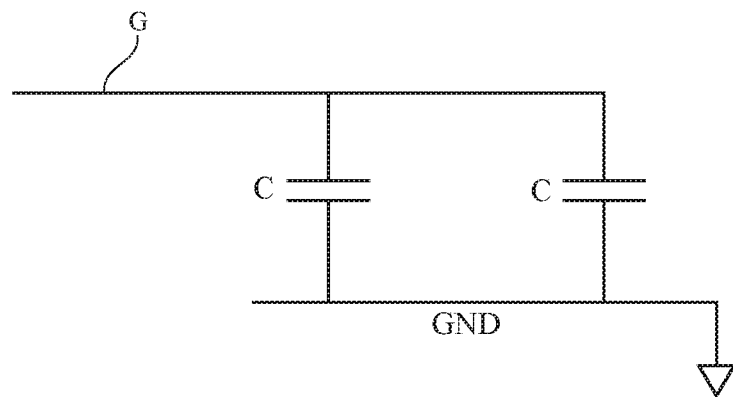
FIG. 19 is a circuit diagram showing how capacitors may be coupled to a gate line to add loading to the gate line in accordance with an embodiment.

FIG. 19 is a circuit diagram of an illustrative supplemental loading structure formed from two capacitors C coupled between in parallel between gate line G and ground line GND. Ground line GND may be formed from a ground power supply line (e.g., ELVSS), from a gate driver ground (e.g., VGL), or other suitable signal path. Capacitors C of FIG. 19 may be formed from structures of the type shown in FIGS. 20 and 21 (as examples).

Figure 20:
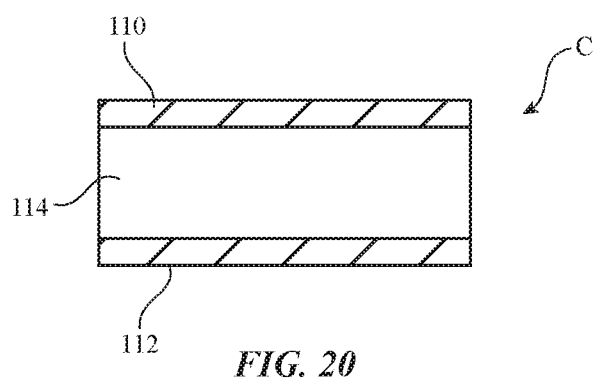
FIGS. 20 and 21 are cross-sectional side views of illustrative capacitors in accordance with an embodiment.

In the example of FIG. 20, capacitor C has first electrode 110 and second electrode 112 separated by dielectric 114. Dielectric 114 may be formed from one or more layers of inorganic and/or organic dielectric material in display 14. Electrodes 110 and 112 may be formed from metal layers, conductive semiconductor layers (e.g., doped polysilicon, etc.), or other conductive layers. For example, electrodes 110 and 112 may be formed from conductive layers such as a first gate metal layer, second gate metal layer, source-drain metal layer, silicon layer, or other suitable conductive layers in the thin-film transistor circuitry of display 14. In particular, electrode 110 may be an upper electrode formed from a second gate metal layer and electrode 112 may be a lower electrode formed from a first gate metal layer, upper electrode 110 may be formed from a source-drain metal layer and lower electrode 112 may be formed from a second gate metal layer, or upper electrode 110 may be formed from a first gate metal layer or a source-drain metal layer and lower electrode 112 may be formed from a doped polysilicon layer or other doped semiconductor layer.

Figure 21:
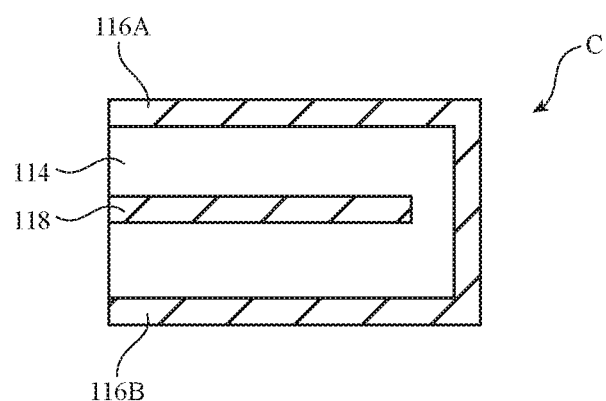

In the illustrative configuration of FIG. 21, a first electrode for capacitor C is formed from upper layer 116A and lower layer 116B, which are shorted together. A second electrode for capacitor C of FIG. 21 is formed from conductive layer 118. Dielectric 114 may separate the first and second electrodes. Electrode layer 116A may be formed from a source-drain metal layer and electrode layer 116B may be formed from a conductive layer such as a doped semiconductor layer (e.g., a doped polysilicon layer). Electrode 118 may be formed from a gate metal layer (e.g., a first gate metal layer in a configuration in which display 14 has multiple gate metal layers).

Other capacitor arrangements may be used, if desired. The illustrative capacitor structures of FIGS. 20 and 21 are merely illustrative. Capacitors C may be formed from individual capacitor electrodes that are coupled together using signal lines (e.g., gate lines and ground line). Different numbers of capacitors may be added or removed from each row to adjust how much supplemental gate line loading is provided or each row of display 14 may have a single undivided capacitor structure for supplemental loading. The use of multiple smaller capacitors that are coupled together by signal lines (e.g., gate lines and ground lines) may help reduce the risk of damage from electrostatic discharge events during manufacturing (e.g., by reducing the amount of charge stored in any given capacitor).

Figure 22:
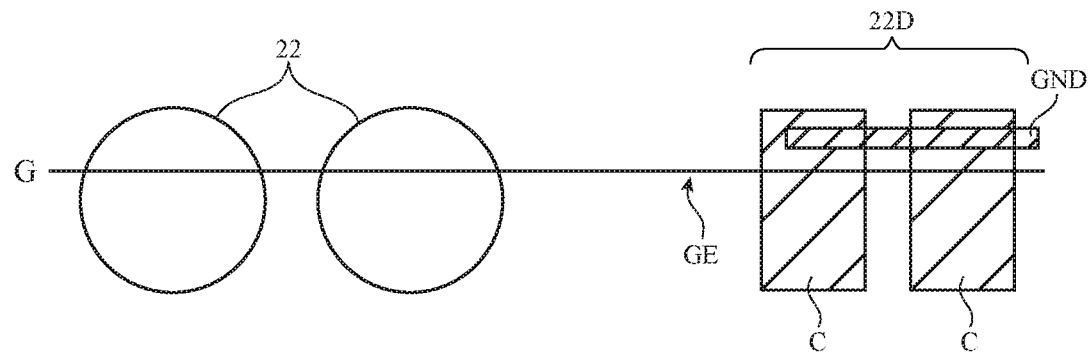
FIG. 22 is a diagram of an illustrative row in a display with capacitors for providing gate line loading in accordance with an embodiment.

FIG. 22 shows a row of display 14 in an illustrative configuration in which supplemental loading structure 22D has been formed from multiple capacitors C (e.g., capacitors of the type shown in FIGS. 20 and/or 21) coupled to gate line G and coupled to an associated ground line GND.

Figure 23:
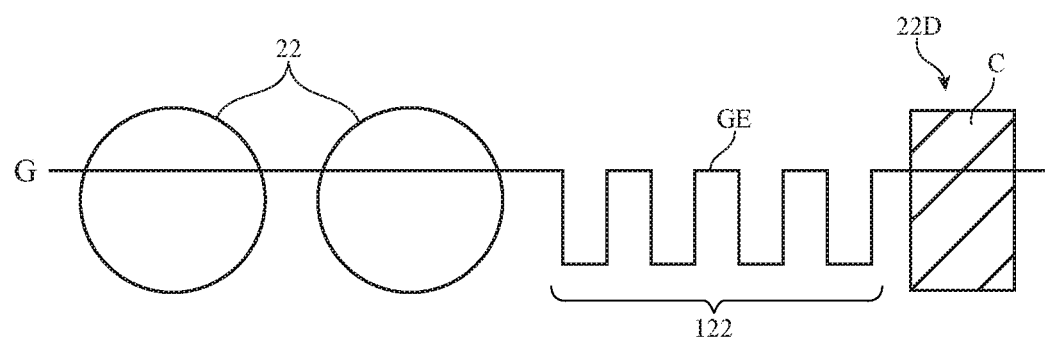
FIG. 23 is a diagram of an illustrative row in a display in which a gate line has been provided with a meandering path segment to adjust gate line loading in accordance with an embodiment.

FIG. 23 shows how the resistance of gate line G in gate line extension GE can be adjusted by providing a portion of gate line extensions GE such as portion 122 with a meandering path shape. Gate line extension G may be coupled to a supplemental load such as loading structures 22D formed from one or more capacitors C or other loading structures. Adjustments to the resistance of line portion GE may help adjust the loading effects imposed on gate line G (i.e., the meandering path may be considered to form part of the supplemental gate line loading structures in a row).

Figure 24:
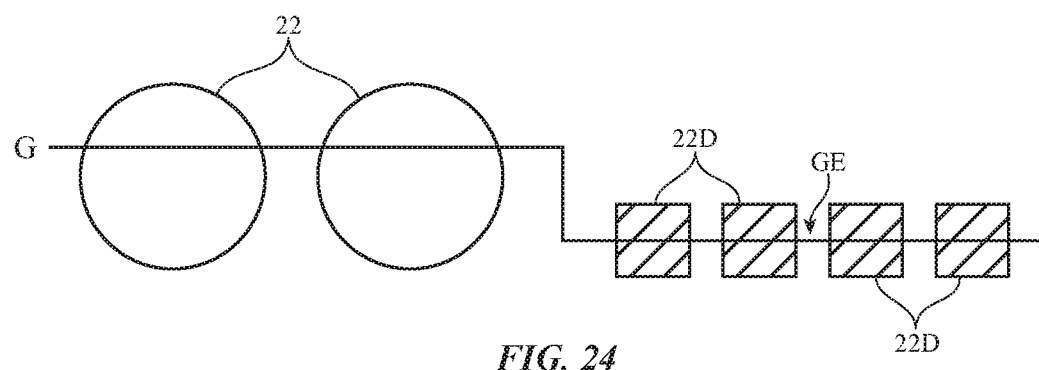
FIG. 24 is a diagram of an illustrative row in a display in which a gate line has been loaded with reduced-footprint non-emissive pixel circuits that serve as supplemental gate line loading structures in accordance with an embodiment.

FIG. 24 shows how supplemental loading structures 22D may be formed from small pixel-like dummy pixel circuits. These circuits may include some of the same transistors, capacitors, signal traces, and other thin-film circuitry of normal pixels 22, but have smaller footprints because some of the components of pixels 22 have been omitted. The omission of one or more pixel components from pixels 22 allows the footprint of the dummy pixel circuits to be reduced and renders the dummy pixel circuits incapable of emitting light. At the same time, the amount of loading imposed on gate lines G may be the same or nearly the same as that imposed by normal pixels 22. An example of a pixel component that may be removed from pixels 22 to form reduced-size (compressed) dummy pixel circuits for supplemental loading structures 22D of FIG. 24 is the anode of light-emitting diode 44 (which normally consumes a relatively large amount of pixel area). To reduce the size of the dummy pixel circuit relative to a normal pixel 22, the layout of the pixel circuit may be shrunken after the anode is removed. In contrast, dummy pixels 22D of the type shown in FIG. 14 may have the same footprint as pixels 22.

Figure 25:
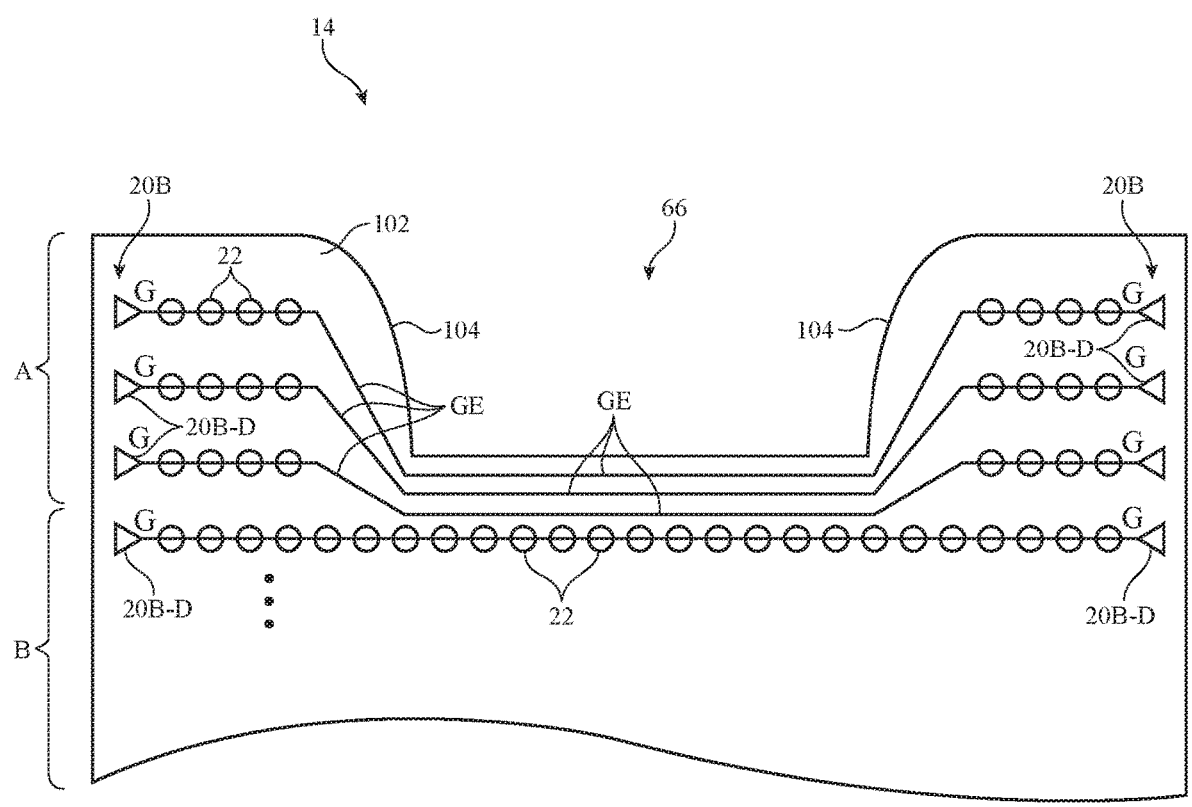
FIG. 25 is a diagram of an illustrative display with gate lines having extensions that extend across an inactive area of the display past a notch in the display in accordance with an embodiment.

If desired, each of the gate lines in area A may have a pixel-free portion (gate line extension portion) that extends past the notch in display 14 and that helps increase loading for that gate line. As shown in FIG. 25, for example, gate line extensions GE may be extended sufficiently to allow each of the gate lines in the short rows to span the width of display 14 (i.e., the substrate of display 14) even though the short rows contain fewer pixels than the long rows due to the presence of notch 66. Gate line extensions GE of FIG. 25 may impose sufficient loading on the short rows of display 14 to partly or completely obviate the need for additional supplemental gate line loading structures and/or gate signal slew rate modifications, gate driver circuit modifications, etc.

In the illustrative configuration of FIG. 25, gate driver circuitry 20B includes gate drivers 20B-D coupled to both the left and right ends of gate lines G. In the long rows of display 14 (i.e., in area B), the use of drivers on both the left and right ends of each gate line can help ensure satisfactory data loading. In short rows (i.e., in area A), both left and right drivers may not be needed and one of these drivers may be omitted to help reduce display brightness variations. With this type of arrangement, some or all of gate drivers 20B-D along one of the edges of display 14 (e.g., the right-hand edge of FIG. 25) may be omitted from the short rows of display 14 so that some or all of the short rows may be driven by gate drivers coupled to only one gate line end (e.g., the left end of gate lines G), whereas all of the long rows may be driven by gate drivers coupled to both opposing ends of gate lines G (e.g., to the left and right ends of each gate line G). Configurations of this type (in which the number of gate drivers coupled to each gate line is varied between different rows) may be combined with one or more other arrangements for smoothing out display brightness variations (row-dependent gate line signal slew rate variations, row-dependent gate driver strengths, row-dependent supplemental loading variations, etc.).

In accordance with an embodiment, a display is provided that includes display driver circuitry, data lines coupled to the display driver circuitry, gate lines coupled to the display driver circuitry, and an array of pixels having columns and rows, the rows in a first area of the display are shorter than the rows in a second area of the display and the display driver circuitry is configured to provide gate line signals on the gate lines of the rows in the first and second areas that are different.

In accordance with another embodiment, the display driver circuitry includes a first clock generator that generates a first clock signal and a second clock generator that generates a second clock signal.

In accordance with another embodiment, the display driver circuitry includes a multiplexer having a first input that receives the first clock signal, a second input that receives the second clock signal, and an output coupled to a clock path.

In accordance with another embodiment, the display driver circuitry includes gate driver circuitry having gate driver circuits in each of the rows, the gate driver circuits receive signals over the clock path.

In accordance with another embodiment, the first area has a pixel-free notch and the display driver circuitry is configured to direct the multiplexer to supply the first clock signal to the gate driver circuits in the rows of the first area and to supply the second clock signal to the gate driver circuits in the rows of the second area.

In accordance with another embodiment, the first clock signal and corresponding gate line signals produced by the gate driver circuits in the rows of the first area have a slower slew rate than the second clock signal and corresponding gate line signals produced by the gate driver circuits in the rows of the second area.

In accordance with another embodiment, the first clock signal and corresponding gate line signals produced by the gate driver circuits in the rows of the first area have a shorter pulse duration than the second clock signal and corresponding gate line signals produced by the gate driver circuits in the rows of the second area.

In accordance with another embodiment, the first clock signal and corresponding gate line signals produced by the gate driver circuits in the rows of the first area have a two-step profile and the second clock signal and corresponding gate line signals produced by the gate driver circuits in the rows of the second area have a one-step profile.

In accordance with another embodiment, each pixel has seven transistors and one capacitor.

In accordance with another embodiment, the seven transistors in each pixel include a drive transistor and first and second emission transistors coupled in series with an organic light-emitting diode between first and second power supply terminals.

In accordance with another embodiment, the display includes in each row, a first emission control line that passes a first emission control signal to the pixels of that row from the display driver circuitry and a second emission control line that passes a second emission control signal to the pixels of that row from the display driver circuitry.

In accordance with another embodiment, each pixel has seven transistors and one capacitor.

In accordance with another embodiment, the seven transistors in each pixel include a drive transistor and first and second emission transistors coupled in series with an organic light-emitting diode between first and second power supply terminals.

In accordance with another embodiment, the first emission line in each row is coupled to the first emission transistor of each pixel in that row and the second emission line in each row is coupled to the second emission transistor of each pixel in that row.

In accordance with an embodiment, a display is provided that includes display driver circuitry, data lines coupled to the display driver circuitry, gate lines coupled to the display driver circuitry, an array of pixels having columns and rows, each pixel has seven transistors and one capacitor, the seven transistors in each pixel include a drive transistor and first and second emission transistors coupled in series with an organic light-emitting diode between first and second power supply terminals, and in each row, a first emission control line that passes a first emission control signal to the pixels of that row from the display driver circuitry and a second emission control line that passes a second emission control signal to the pixels of that row from the display driver circuitry.

In accordance with another embodiment, the first emission line in each row is coupled to the first emission transistor of each pixel in that row and the second emission line in each row is coupled to the second emission transistor of each pixel in that row.

In accordance with an embodiment, a display is provided that includes display driver circuitry, data lines coupled to the display driver circuitry, gate lines coupled to the display driver circuitry, an array of pixels having columns and rows, each pixel has at least seven p-channel metal-oxide-semiconductor transistors and at least one capacitor, the transistors in each pixel include a drive transistor and first and second emission transistors coupled in series with an organic light-emitting diode between first and second power supply terminals, a first emission control line in each row that passes a first emission control signal to the pixels of that row from the display driver circuitry, a second emission control line in each row that passes a second emission control signal to the pixels of that row from the display driver circuitry, and first and second gate lines in each row that control at least first and second switching transistors in the transistors of each pixel in that row.

In accordance with another embodiment, the display driver circuitry includes a first clock generator that generates a first clock signal and a second clock generator that generates a second clock signal and includes a multiplexer having a first input that receives the first clock signal, a second input that receives the second clock signal and an output coupled to a clock path.

In accordance with another embodiment, the first emission line in each row is coupled to the first emission transistor of each pixel in that row and the second emission line in each row is coupled to the second emission transistor of each pixel in that row.

In accordance with another embodiment, the display driver circuitry includes a gate driver circuit in each of the rows that receive signals over the clock path.

In accordance with an embodiment, a display is provided that includes display driver circuitry, data lines coupled to the display driver circuitry, gate lines coupled to the display driver circuitry, an array of pixels having rows and columns, the gate lines of rows in a first area of the display are coupled to fewer of the pixels in the array of pixels than the rows in a second area of the display, and supplemental gate line loading structures that are coupled to at least some of the gate lines in the first area to increase loading on those gate lines and thereby smooth out display brightness variations between the first and second areas of the display.

In accordance with another embodiment, the supplemental gate line loading structures include dummy pixels that do not emit light.

In accordance with another embodiment, the dummy pixels do not contain emissive material for light-emitting diodes.

In accordance with another embodiment, the supplemental gate line loading structures include capacitors.

In accordance with another embodiment, a first of the rows in the first area is coupled to a supplemental gate line loading structure in a second of the rows of the first area.

In accordance with another embodiment, the pixels of the first of the rows are associated with a given one of the gate lines and the given one of the gate lines has a gate line extension that extends from the first of the rows to the second of the rows.

In accordance with another embodiment, the supplemental gate line loading structures impose progressively decreasing amounts of loading on the gate lines of the first area at progressively increasing distances from the second area into the first area.

In accordance with an embodiment, an organic light-emitting diode display is provided that includes a substrate with a notch, organic light-emitting diode pixels on the substrate, display driver circuitry, data lines coupled to the display driver circuitry and the organic light-emitting diode pixels, gate lines coupled to the display driver circuitry and the organic light-emitting diode pixels, the organic light-emitting diode pixels are arranged in columns and rows, the rows in a first area of the display that includes the notch are coupled to fewer of the pixels than the rows in a second area of the display, and supplemental gate line loading structures that are coupled to at least a portion of the gate lines in the first area to increase gate line loading on those gate lines and thereby reduce differences in gate line loading between the gate lines in the first and second areas.

In accordance with another embodiment, the supplemental gate line loading structures include capacitors coupled to the gate lines in the portion of the gate lines.

In accordance with another embodiment, each gate line in the portion of the gate lines is coupled to a plurality of the capacitors.

In accordance with another embodiment, each of the capacitors has an upper electrode and a lower electrode.

In accordance with another embodiment, each of the capacitors has a first conductive layer, a second conductive layer, and a third conductive layer, the first and third conductive layers are shorted together and form a first capacitor electrode and the second conductive layer is interposed between the first and third conductive layers and forms a second capacitor electrode.

In accordance with another embodiment, the supplemental gate line loading structures apply different amounts of capacitance to different gate lines in the first area.

In accordance with another embodiment, the gate driver circuitry includes a gate driver coupled to one of the gate lines in each row and at least one of the gate drivers in the first area has a different strength than at least one of the gate drivers in the second area.

In accordance with another embodiment, the display driver circuitry is configured to provide gate line signals on the gate lines of the rows in the first and second areas that have different slew rates.

In accordance with an embodiment, an organic light-emitting diode display is provided that includes a substrate with a notch, the substrate has a width, organic-light-emitting diode pixels on the substrate, display driver circuitry, data lines coupled to the display driver circuitry and coupled to the pixels, and gate lines coupled to the display driver circuitry and coupled to the pixels, the pixels have columns and rows, the gate lines of the rows in a first area of the display are coupled to fewer of the pixels than the gate lines of the rows in the second area, the gate lines of the rows in both the first area and the second area span the width of the substrate, and the gate lines of the rows in the first area each have a pixel-free portion that extends past the notch.

In accordance with another embodiment, the organic light-emitting diode display includes supplemental gate line loading structures that are coupled to a first set of gate lines in the first area to increase gate line loading on the first set of gate lines and thereby reduce differences in gate line loading between the first set of gate lines and a second set of gate lines in the second area.

In accordance with another embodiment, the supplemental gate line loading structures include dummy pixels.

In accordance with another embodiment, the supplemental gate line loading structures include at least one capacitor coupled to each gate line in the first set of gate lines.

In accordance with another embodiment, the supplemental gate line loading structures includes capacitors coupled to the first set of gate lines and at least a given one of the gate lines in the first set of gate lines is coupled to a capacitor in a different row than the given one of the gate lines.

The foregoing is merely illustrative and various modifications can be made by those skilled in the art without departing from the scope and spirit of the described embodiments. The foregoing embodiments may be implemented individually or in any combination.

What is claimed is:

1. A display having an active area with a notch, comprising:
    a substrate;
    organic light-emitting diode pixels on the substrate, wherein some of the organic light-emitting diode pixels are positioned on a first side of the notch and some of the organic light-emitting diode pixels are positioned on a second side of the notch;
    display driver circuitry;
    data lines coupled to the display driver circuitry and the organic light-emitting diode pixels;
    gate lines coupled to the display driver circuitry and the organic light-emitting diode pixels, wherein the organic light-emitting diode pixels are arranged in columns and rows, wherein the gate lines in a first area of the display that includes the notch are coupled to fewer of the organic light-emitting diode pixels than the gate lines in a second area of the display; and
    dummy pixels that are coupled to the gate lines in the first area.

2. The display defined in claim 1, wherein the dummy pixels do not emit light.

3. The display defined in claim 1, wherein the dummy pixels do not contain emissive material for light-emitting diodes.

4. The display defined in claim 1, wherein the dummy pixels impose progressively decreasing amounts of loading on the gate lines of the first area at progressively increasing distances between the second area and the gate lines of the first area.

5. The display defined in claim 1, wherein a first gate line in the first area of the display is coupled to a first number of dummy pixels, wherein a second gate line in the first area of the display is coupled to a second number of dummy pixels, and wherein the first number is greater than the second number.

6. The display defined in claim 5, wherein the first gate line is a first distance from the second area, wherein the second gate line is a second distance from the second area, and wherein the second distance is greater than the first distance.

7. The display defined in claim 1, wherein the dummy pixels do not include anodes.

8. The display defined in claim 1, wherein the dummy pixels are positioned in the notch.

9. The display defined in claim 8, wherein the dummy pixels are positioned on the substrate in an inactive area of the display.

10. The display defined in claim 1, wherein rows in the first area of the display are interrupted by the notch.

11. A display having an active area and an inactive area, comprising:
    a substrate with a notch, wherein the notch has first and second opposing sides;
    organic light-emitting diode pixels on the substrate that form the active area, wherein some of the organic light-emitting diode pixels are positioned on the first side of the notch and some of the organic light-emitting diode pixels are positioned on the second side of the notch;
    display driver circuitry;
    gate lines coupled to the display driver circuitry and rows of the organic light-emitting diode pixels; and
    dummy pixels that are coupled to at least some of the gate lines and that are formed in the inactive area between the active area and the notch.

12. The display defined in claim 11, wherein the dummy pixels do not emit light.

13. The display defined in claim 11, wherein the dummy pixels do not contain emissive material for light-emitting diodes.

14. The display defined in claim 11, wherein the dummy pixels do not include anodes.

15. The display defined in claim 11, wherein the dummy pixels impose loading on the gate lines of rows interrupted by the notch.

16. A display having an active area and an inactive area, comprising:
- a substrate with a notch, wherein the notch has first and second opposing sides connected by a third side;
- organic light-emitting diode pixels on the substrate that form the active area, wherein some of the organic light-emitting diode pixels are positioned on the first side of the notch and some of the organic light-emitting diode pixels are positioned on the second side of the notch;
- display driver circuitry;
- data lines coupled to the display driver circuitry and the organic light-emitting diode pixels; and
- gate lines coupled to the display driver circuitry and the organic light-emitting diode pixels, wherein the organic light-emitting diode pixels are arranged in columns and rows, wherein the gate lines in a first area of the display that includes the notch are coupled to fewer of the organic light-emitting diode pixels than the gate lines in a second area of the display, wherein the gate lines in the first area include a gate line that extends in the inactive area between the notch and the active area from the first side of the notch to the second side of the notch, wherein the gate line in the first area of the display is coupled to only one gate driver, and wherein an additional gate line in the second area of the display is coupled to first and second gate drivers.

17. The display defined in claim 16, wherein the gate line extends parallel to the third side of the notch in the inactive area between the notch and the active area from the first side of the notch to the second side of the notch.

18. The display defined in claim 16, wherein the gate line is one of multiple gate lines in the first area that extends in the inactive area between the notch and the active area from the first side of the notch to the second side of the notch.

* * * * *